(12) United States Patent
Kang

(10) Patent No.: US 8,163,646 B2
(45) Date of Patent: Apr. 24, 2012

(54) INTERCONNECTION WIRING STRUCTURE OF A SEMICONDUCTOR DEVICE AND METHOD FOR MANUFACTURING SAME

(75) Inventor: Chun Soo Kang, Yongin-si (KR)

(73) Assignee: Hynix Semiconductor Inc., Icheon-si (KR)

(*) Notice: Subject to any disclaimer, the term of this patent is extended or adjusted under 35 U.S.C. 154(b) by 316 days.

(21) Appl. No.: 12/615,037

(22) Filed: Nov. 9, 2009

(65) Prior Publication Data

US 2010/0327407 A1    Dec. 30, 2010

(30) Foreign Application Priority Data

Jun. 29, 2009  (KR) .................. 10-2009-0058550

(51) Int. Cl.
*H01L 21/4763* (2006.01)

(52) U.S. Cl. ........ 438/622; 438/694; 438/700; 438/697; 438/478; 438/253; 438/254; 257/532; 257/E23.168; 257/E21.575

(58) Field of Classification Search .................. 438/622, 438/694, 700, 697, 478, 253, 254; 257/532, 257/E23.168, E21.575
See application file for complete search history.

(56) References Cited

U.S. PATENT DOCUMENTS

2006/0091447 A1  5/2006  Ema

FOREIGN PATENT DOCUMENTS

| KR | 1020030049479 | 6/2003 |
| KR | 10-2004-0006513 | 1/2004 |
| KR | 1020040057534 | 7/2004 |
| KR | 10-0577542 | 4/2006 |
| KR | 10-2007-0111179 | 11/2007 |

*Primary Examiner* — Marcos D. Pizarro
*Assistant Examiner* — Eva Yan Montalvo
(74) *Attorney, Agent, or Firm* — Marshall, Gerstein & Borun LLP

(57) ABSTRACT

A method for manufacturing an interconnection wiring structure of a semiconductor device includes forming an isolation region, which arranges active regions in a diagonal direction, in a semiconductor substrate; forming first damascene trenches, which open upper portions of a bit line contacts, by selectively etching a second interlayer insulation layer; forming bit lines which fill the first damascene trenches; forming second damascene trenches, which expose portions of the active region, by selectively etching the portion of a second interlayer insulation layer between the bit lines and the portion of the first interlayer insulation layer thereunder; attaching trench spacer on side walls of the second damascene trench; forming storage node contact lines which fill the second damascene trenches.

20 Claims, 22 Drawing Sheets

INTERCONNECTION WIRING STRUCTURE OF A SEMICONDUCTOR DEVICE AND METHOD FOR MANUFACTURING SAME

CROSS-REFERENCE TO RELATED APPLICATIONS

The present application claims priority to Korean patent application number 10-2009-0058550, filed on Jun. 29, 2009, which is incorporated by reference in its entirety.

FIELD OF TECHNOLOGY

The present disclosure relates generally to semiconductor devices, and, more particularly, to interconnection wiring structures of semiconductor devices and methods for manufacturing same.

BACKGROUND

Venous techniques have be used to integrate more circuit patterns within a limited area of a wafer or a semiconductor substrate. In the case of Dynamic Random Access Memory (DRAM) devices, for example, various techniques have been used to change an arrangement of active regions from an $8F^2$ cell layout into a $6F^2$ layout.

DRAM devices typically include bit lines for writing and reading data to and from cells in memory and word lines for selecting the particular cell to which data is written and from which data is read. Bit lines and word line are often arranged perpendicular to each other. The $6F^2$ cell layout has repeatedly arranged active regions diagonally with respect to the word line. The active region with a diagonal pattern is arranged in a rectangular pattern which extends in a diagonal direction intersecting with the bit line by an angle of about 27°. In this active region, the word line, including a gate intersecting in a diagonal direction by about 63°, with the bit is arranged and the bit line is arranged to be electrically coupled to the active region through a bit line contact and a pad.

A memory cell of the DRAM device includes a single transistor and a single capacitor, and the capacitor is stacked on an upper portion of the bit line. A storage node contact coupled to a storage node of the capacitor is formed penetrating through an insulation layer, passing by the bit line, and is electrically coupled to the active region thereunder through a storage node contact pad prepared in a lower portion of the contact.

Since a gap between the bit lines is much narrowed due to reduction of design rule, it becomes difficult to ensure a process margin for insulation between the storage node contact and the bit line. When forming the storage node contact by a Self Aligned Contact (SAC) process, a wider gap between the bit lines should be ensured to ensure a SAC margin. However, a Critical Dimension (CD) of the bit line should be reduced more in order to ensure the gap between the bit lines, and this reduction in the CD of the bit line can reduce an overlay margin between the bit line and the bit line contact and cause resulting increase in a resistance due to reduction in a contact area.

In order to ensure more overlay margin between the bit line and the bit line contact while reducing the CD of the bit line, a method of designing a layout of the bit line in a shape of a dog bone, in which a middle portion of the bit line to be overlaid with the contact is designed wider than the other portions, can be considered. However, since it is difficult to ensure precision in pattern transfer by a lithography process when a cell design rule of 40 nm or less is applied, it is difficult to precisely form the dog bone shape into a pattern.

Therefore, it is difficult to provide a separation margin, by which a capping layer or a hard mask formed on the bit line can sufficiently separate the contacts, in the SAC process for the storage node contact which is performed after the formation of the bit line. That is to say, it is difficult to form a CD of the capping layer in a sufficient size since it is difficult to pattern transfer the bit line in a form capable of ensuring a sufficient CD and it is accordingly difficult for the capping layer to function as an isolation layer in an etching or polishing process for isolating the contacts from each other in the SAC process. There can be caused defect in that bridge between the contacts is generated due to the insufficient CD of the capping layer or the storage node contact and the bit line contact are interconnected due to the insufficient gap margin therebetween.

SUMMARY

In one embodiment, a method for manufacturing an interconnection wiring structure of a semiconductor device includes forming an isolation region, wherein the isolation region arranges an active region in a diagonal direction with respect to a semiconductor substrate; forming a first interlayer insulation layer on the active region; forming a bit line contact, wherein the bit line contact penetrates the first interlayer insulation layer, and wherein the bit line contacts is coupled to the active region; forming a second interlayer insulation layer, wherein the second interlayer insulation layer covers the bit line contact; forming q first damascene trench by selectively etching the second interlayer insulation layer, wherein the first damascene trench exposes an upper portions of the bit line contact; forming a bit line, wherein the bit lines fills the first damascene trench; forming a second damascene trench by selectively etching the portion of the second interlayer insulation layer between the bit line and a portion of the first interlayer insulation layer under the bit line, wherein the second damascene trench exposes a portion of the active region; attaching a trench spacer on side walls of the second damascene trench; forming a storage node contact line, wherein the storage node contact line fills the second damascene trench; forming a mask having a linear shape, wherein the mask intersects with the storage node contact; forming node separation grooves by selectively etching the portion of the storage node contact line exposed by the mask, wherein the node separation grooves separate the storage node contact line into storage node contacts; and forming a third interlayer insulation layer, wherein the third interlayer insulation layer fills and insulates the node separation groove.

In another embodiment, a method for manufacturing an interconnection wiring structure of a semiconductor device, includes forming a first interlayer insulation later; forming a first bit line contact, wherein the first bit line contact penetrates the first interlayer insulation layer, and wherein the first bit line contact is aligned with a cell region on a semiconductor substrate; forming a second bit line contact, wherein the second bit line contact penetrates the first interlayer insulation layer, and wherein the second bit line contact is aligned with a peripheral region on the semiconductor substrate; forming a second interlayer insulation layer, wherein the second interlayer insulation layer covers the first bit line contact and the second bit line contact; forming first and second damascene trenches by selectively etching the second interlayer insulation layer, wherein the first and second damascene trenches expose upper portions of the first and second bit line contacts, respectively; forming first and second bit lines, wherein the first and second bit lines fill the first and second damascene trenches respectively; forming a third damascene trench by selectively etching a portion of the second interlayer insulation layer between the first bit line and a portion of the first interlayer insulation layer thereunder, wherein the third damascene trench exposes a portion of the semiconductor substrate in the cell region; attaching trench spacer on side walls of the third damascene trench; forming a storage node contact line, wherein the storage node contact line fills the third damascene trench; forming a mask having an opening of a linear shape, wherein the opening intersects with the storage node contact; forming node separation grooves by selectively etching a portion of the storage node contact line exposed by the mask, wherein the node separation grooves separate the storage node contact line into storage node contacts; forming a third interlayer insulation layer, wherein the third interlayer insulation layer fills and insulates the node separation grooves; forming a capacitor having a storage node connected to the storage node contact; forming a fourth interlayer insulation layer, wherein the fourth interlayer insulation layer covers the capacitor; forming a contact hole, wherein the contact hole penetrates the fourth and second interlayer insulation layers on the peripheral region of the semiconductor substrate, and wherein the contact hole is aligned with the second bit line; and forming an interconnection contact, wherein the interconnection contact fills the contact hole.

In further another embodiment, an interconnection wiring structure of a semiconductor device includes bit line contacts formed to penetrate through a first interlayer insulation layer on a semiconductor substrate; bit lines formed to overlay with the bit line contacts; storage node contacts arranged between the bit lines and penetrating the first interlayer insulation layer; trench spacers situated in an interface between the bit lines and the storage node contacts and extending on side faces of the bit line contacts; and a second interlayer insulation layer situated to isolate the storage node contacts.

In yet another embodiment, an interconnection wiring structure of a semiconductor device includes first and second bit line contacts penetrating through a first interlayer insulation layer on a semiconductor substrate and aligned with a cell region and a peripheral region of the semiconductor substrate, respectively; first and second bit lines overlaid with the first and second bit line contacts, respectively; storage node contacts arranged between the first bit lines and penetrating the first interlayer insulation layer; trench spacers situated in an interface between the first bit lines and the storage node contacts and extending on side faces of the first bit line contacts; a second interlayer insulation layer situated to isolate the storage node contacts; a third interlayer insulation layer for isolating the second bit lines; a capacitor having a storage node connected to the storage node contact; a fourth interlayer insulation layer for covering the capacitor and the third interlayer insulation layer; and an interconnection contact penetrating through the fourth and third interlayer insulation layers on the peripheral region of the semiconductor substrate and aligned with the second bit line.

DESCRIPTION OF SPECIFIC EMBODIMENTS

In some embodiments, a bit line structure connected to an active region of a $6F^2$ cell layout may be formed using a single damascene process. Therefore, it may be possible to form a bit line is having an equal CD to a bit line contact and, thus achieve a larger process margin in etch patterning of the bit line. Since a layout of the bit line can be realized not in a dog bone shape but in a straight line shape, it may be possible to achieve a larger process margin upon exposure and development in a photolithography process for transferring the bit line onto a wafer or a semiconductor substrate and it may also be possible to achieve a larger etching process margin in an accompanying selective etching process.

By forming a storage node contact by depositing a conductive layer and then separating the conductive layer, it may be possible to achieve a larger process margin and it may also possible to achieve a gap margin between the bit line and the storage node contact and a patterning margin of the storage node contact more reliably. Therefore, it may be possible to perform a process of forming the storage node contact and the bit line in a more stable manner.

Figure 1A:
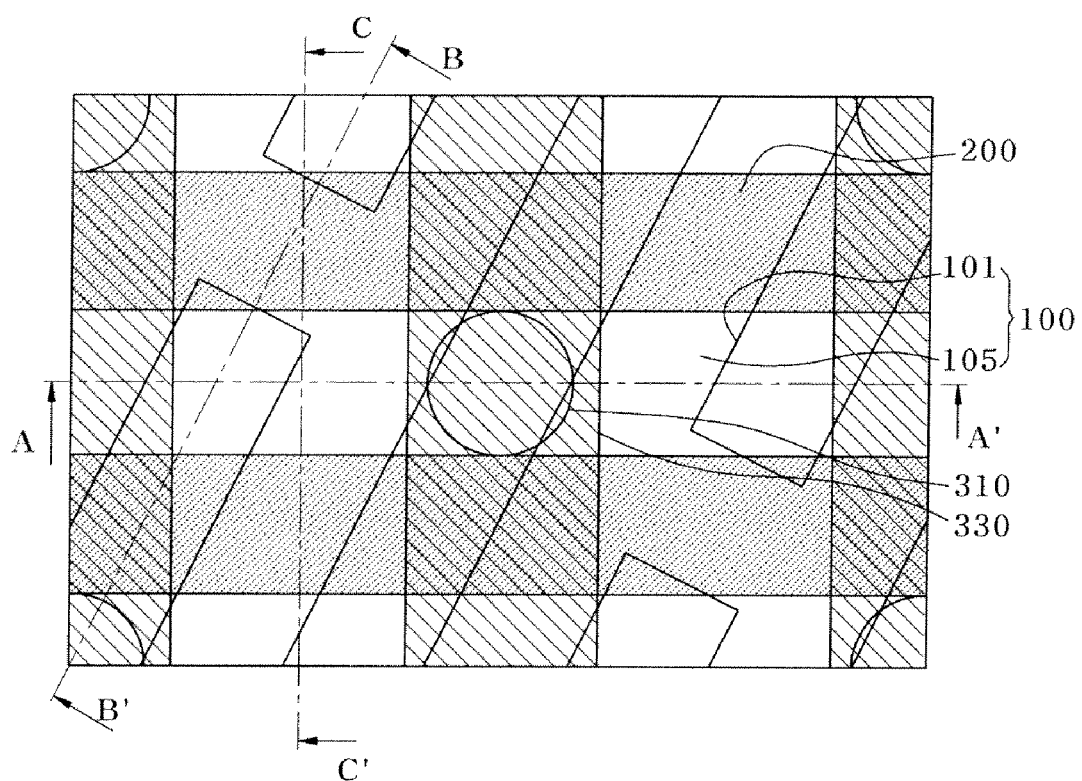
FIG. 1A is a top view illustrating a layout of a bit line in $6F^2$ cell layout.
Figure 1B:
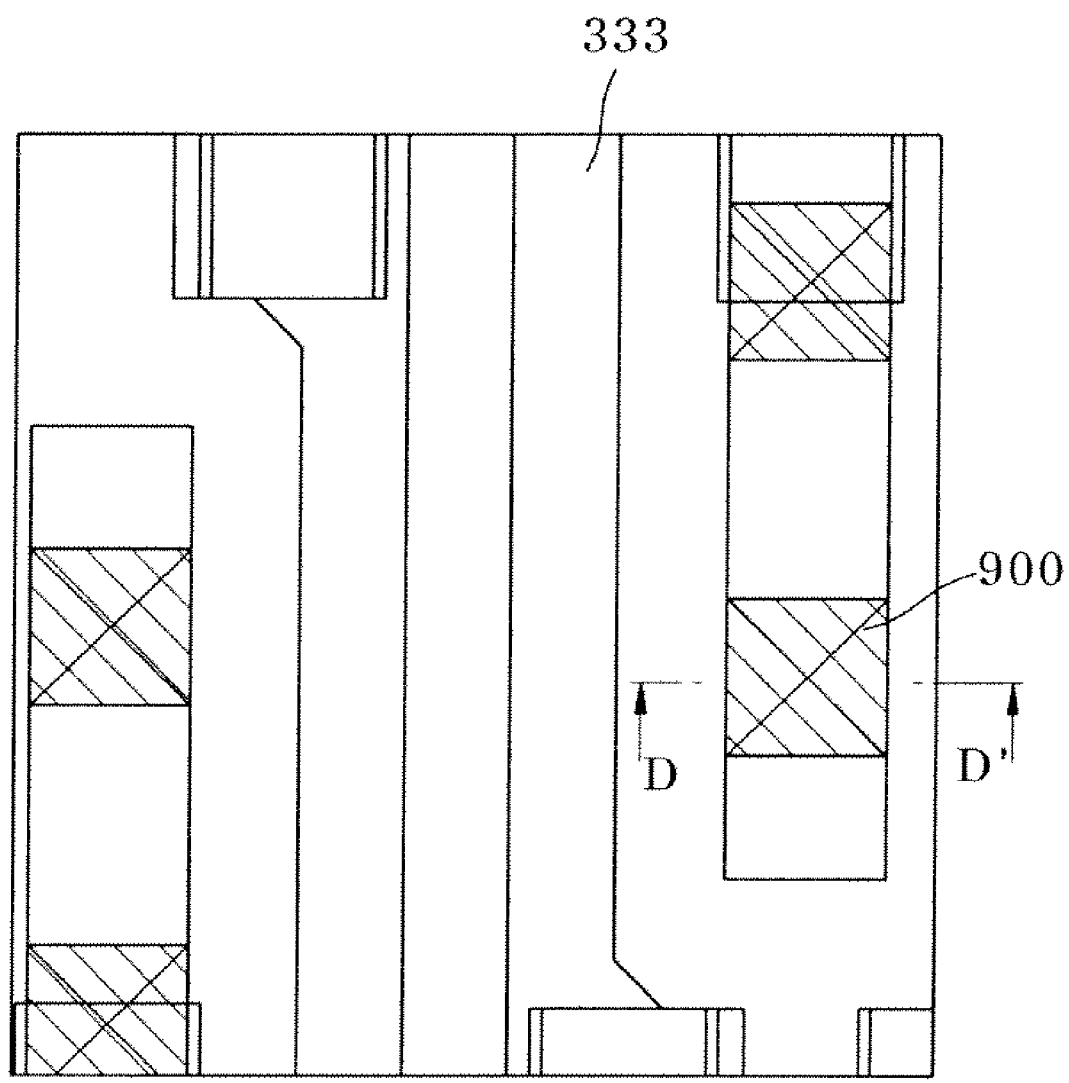
FIG. 1B is a top view illustrating a layout of a bit line in a peripheral region.

FIGS. 1A-1B are top views of a portion of an example semiconductor device, such as a transistor, that includes two bit lines—a first bit line 330 in a cell region, as illustrated in FIG. 1A, and a second bit line 333 in a peripheral region, as illustrated in FIG. 1B. FIGS. 2 through 21 are cross-sectional views illustrating example interconnection wiring structures of the example semiconductor device illustrated in FIGS. 1A-1B.

Referring to FIG. 1A, a semiconductor device may include a first active region 101 that is arranged, for example, in accordance with a $6F^2$ cell layout. The first active region 101 may extend in a straight line and intersect with a gate 200. The gate 200 may extend in a straight line diagonal to the straight line of the first active region 101. The gate 200 may further intersect with the first bit line 330 that may extend in a straight line perpendicular to the straight line of the gate 200. The first bit line 330 may be electrically coupled to the first active region 101 (at the intersection of the first bit line 330 and the first active region 101) via a first bit line contact 310.

In some embodiments, the first bit line contact 310 and the first bit line 330 may have substantially equal CDs. Since the portion of the first bit line 330 overlaid with the first bit line contact 310 may have a CD equal to, or smaller than the CD of the first bit line contact 310, the CD of the first bit line contact 310 can be enlarged to a CD equal to the CD of the first bit line 330.

Since the first bit line 330 may be a straight line, the first bit line 330 and adjacent other bit lines spaced apart from the first bit line 330 may be arranged in a pattern of lines separated by spaces. This pattern may lead to a higher resolution in a photolithography process when transferring a designed layout of the first bit line 330 onto a semiconductor substrate 100. Therefore, since it may be possible to improve the exposure process margin in the photolithography process, the pattern actually formed on the semiconductor substrate 100 can be formed more precisely according to the designed layout of the first bit line 330.

Referring to FIG. 1B, the second bit line 333 in the peripheral region may be formed on the same layer as the first bit line 330. A deep metal contact 900, such as a first metal contact (MC1) may be aligned with and connected to the first bit line 330 in a subsequent process. In some embodiments, since a CD of the metal contact 900 can be set to an equal size to the CD of the second bit line 333, it may be possible to ensure a larger gap between the second bit line 333 and adjacent bit lines and, thus, increase the CD of the second bit line 333. In some embodiments, even when the metal contact 900 and the second bit line 333 are misaligned, it may be possible to prevent a defect, such as a short circuit between the metal contact 900 and the first active region 101 resulting from this misalignment, and thus maintain the CD size of the metal contact 900 equal to that of the second bit line 333.

Figure 2:
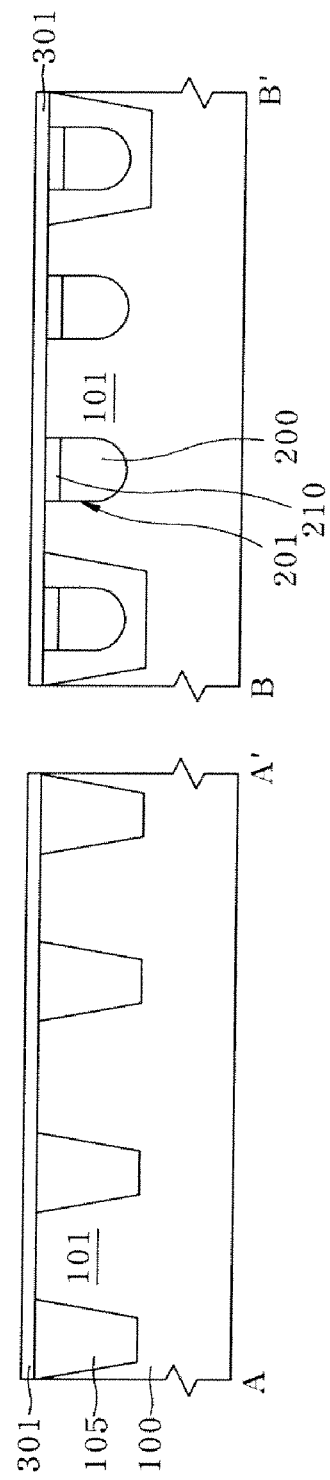
FIGS. 2 through 21 are cross-sectional views illustrating an interconnection wiring structure of a semiconductor device and a method for manufacturing the device.

FIG. 2 illustrates a cross-section of the semiconductor device in FIG. 1A taken along the line A-A' and a cross-section of the semiconductor device in FIG. 1A taken along the line B-B'. In order to isolate the first action region 101 from other regions, an isolation region 105 can be created by forming an isolation trench and filling the isolation trench with an insulation layer, for example, according to a Shallow Trench Isolation (STI) structure. The gate 200 may be formed in a buried gate structure to intersect with the first active region 101. The gate structure may include a gate trench 201 that intersects with the first active region 101 an that may be formed along a direction of a word line. The gate trench 201 may include a gate dielectric layer (not shown), e.g., in the side walls and on the bottom of the gate trench 201.

The gate 200 may include a metal layer, such as a conductive polysilicon layer or a tungsten (W) layer, that fills that gate 200. After the metal layer of the gate 200 is formed to fill the gate trench 201, the metal layer for the gate may be recessed e.g. by an etch back to form a concaved portion in an upper inlet of the gate trench 201. After that, the concaved portion may be filled to form a gate capping layer 210 that covers the upper side of the gate 200. The gate capping layer 210 can be formed by depositing an insulation material, such as silicon oxide ($SiO_2$), and planarizing the deposited insulation material by a planarization method, such as Chemical Mechanical Polishing (CMP). Since this buried gate 200 may be formed in a structure that is buried inside the semiconductor substrate 100, subsequent patterns may be stacked from the surface of the semiconductor substrate after the formation of the gate 200. Therefore, since contact pads, which are introduced when a gate stack is introduced, can be omitted, the depth of a contact hole may be decreased in the subsequent SAC process for the contact formation. Thus, the SAC process margin may be increased.

A first stopper layer 301 may be formed on the semiconductor substrate 100 with a buried gate 200. The first stopper layer 301 may include an insulation material, e.g. silicon nitride ($Si_3N_4$), that may have an etch rate different from that of silicon oxide and, thus, selective to the silicon oxide. The first stopper layer 301 may function as an etch stopper which may prevent a silicon oxide layer formed as the insulation layer in the isolation region 105 from being lost or damaged during an etch process, for example, introduced for the storage node contact.

Figure 3:
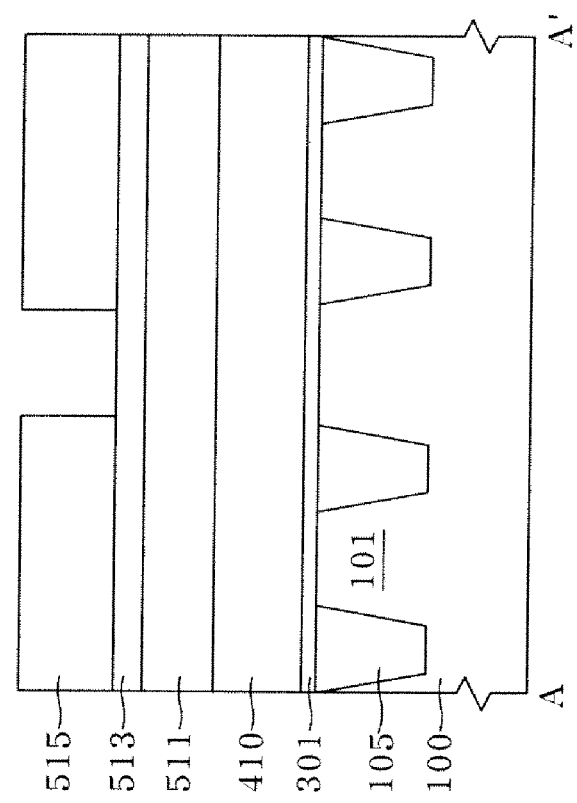

FIG. 3 is a cross-sectional view of a section of a semiconductor device in FIG. 1A taken along the line A-A'. A first interlayer insulation layer 410 may be formed, including a silicon oxide layer on top of the first stopper layer 301. A first hard mask layer 511, such as an a-carbon layer, may be deposited on top of the first interlayer insulation layer 410. Further, a second hard mask layer 513, such as a silicon oxynitride (SiON) layer, may be deposited 513 on top of the first hard mask layer 511. A first photoresist pattern 515, for example, created by an exposure process, may be formed on the second hard mask layer 513. The second hard mask layer 513 (e.g., a SiON layer) may thus function as a layer that prevents interlayer reaction of the first hard mask layer 511 (e.g., an a-carbon layer) with the first photoresist pattern 515. The first hard mask layer 511 (e.g., the a-carbon layer) may function as a main hard mask. The first photoresist pattern 515 may have an opening that exposes a portion of the second hard mask layer 513 corresponding to the portion of the first bit line contact 310 illustrated in FIG. 1A.

Figure 4:
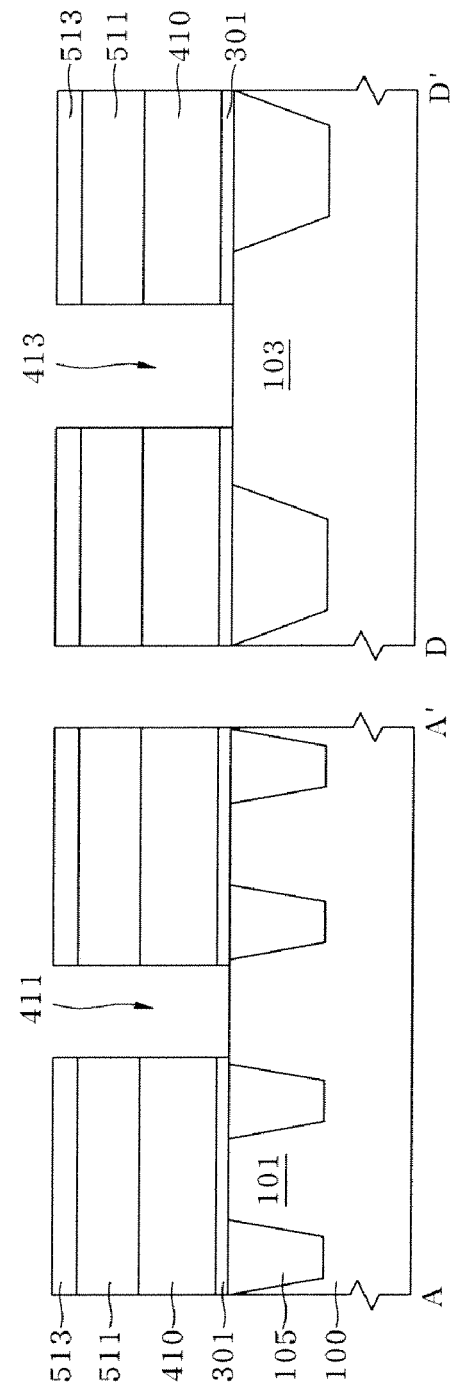

FIG. 4 illustrates a section of the semiconductor device of FIG. 1A taken along the line A-A' and a section of the semiconductor device of FIG. 1B taken along the line D-D'. The second hard mask layer 513 and the first hard mask layer 511 may be patterned by a selective etch using the first photoresist pattern (515 of FIG. 3) as an etch mask to form a first hard mask pattern 511, 513. The portion of the first interlayer insulation layer 410 under the first hard mask pattern 511, 513 that is exposed by the first hard mask pattern 511, 513, may be selectively etched to form a first bit line contact hole 411 that may expose a portion of the first active region 101 in the cell region. At this time, a second bit line contact hole 413 that may expose the second active region 103 in the peripheral region may also be formed. As the first photoresist pattern formed on the peripheral region is formed to a pattern which exposes the portion overlaid with the second active region 103 and the first hard mask pattern 511, 513 including the first and second hard mask layer 511, 513 is also patterned to open the portion overlaid with the second active region 103, the second bit line contact hole 413 is formed on the peripheral region by a selective etch process using the first hard mask pattern 511, 513 as an etch mask.

Figure 5:
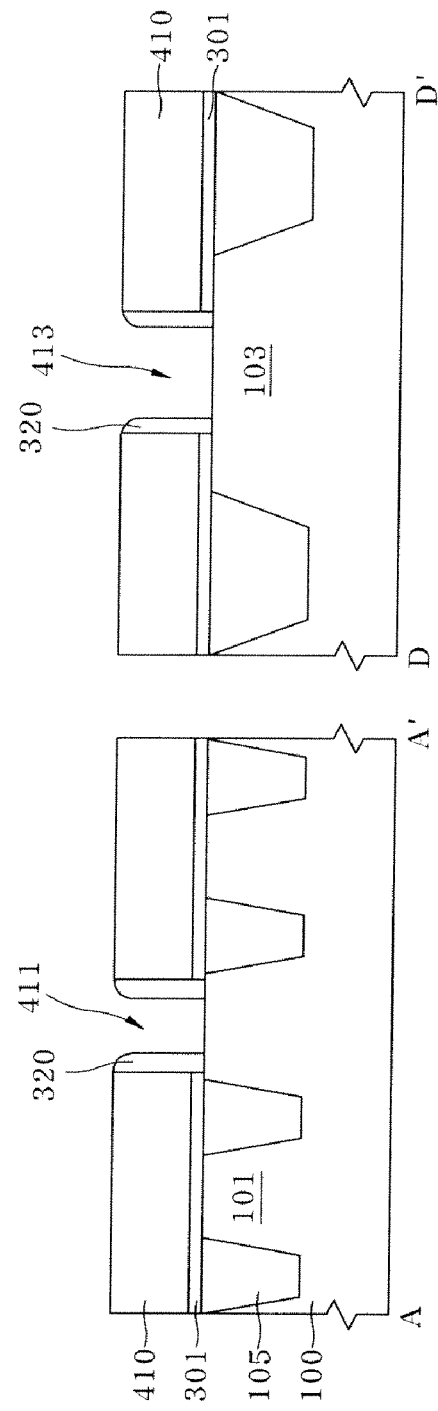

Referring to FIG. 5, the first hard mask pattern 511, 513 may be selectively removed and then a layer for a hole spacer may be deposited on the first inter layer insulation layer 410 through which the first and second bit line contact holes 411, 413 may penetrate. After that, the hole spacer layer may be etched back, or anisotropically dry etched, to form a hole spacer 320 that may be attached to inner walls of the first and second bit line contact holes 411, 413. The hole spacer 320 may include an insulation material, e.g. silicon nitride ($Si_3N_4$), which may have an etch rate different from the first interlayer insulation layer 411 to realize a desired etch selectivity.

A CD of the hole spacer 320 may depend on the deposition thickness of the hole spacer layer. The CD of the hole spacer 320 can be controlled by controlling the deposition thickness, which may control CDs of the first and second bit line contact holes 411, 413 exposed by the hole spacer 320. That is, by controlling the thickness of the layer for the hole spacer 320, it may be possible to control the CDs of the first and second bit line contact holes 411, 413. Therefore, it may be possible to achieve larger margin in forming the first and second bit line contact holes 411, 413.

Figure 6:
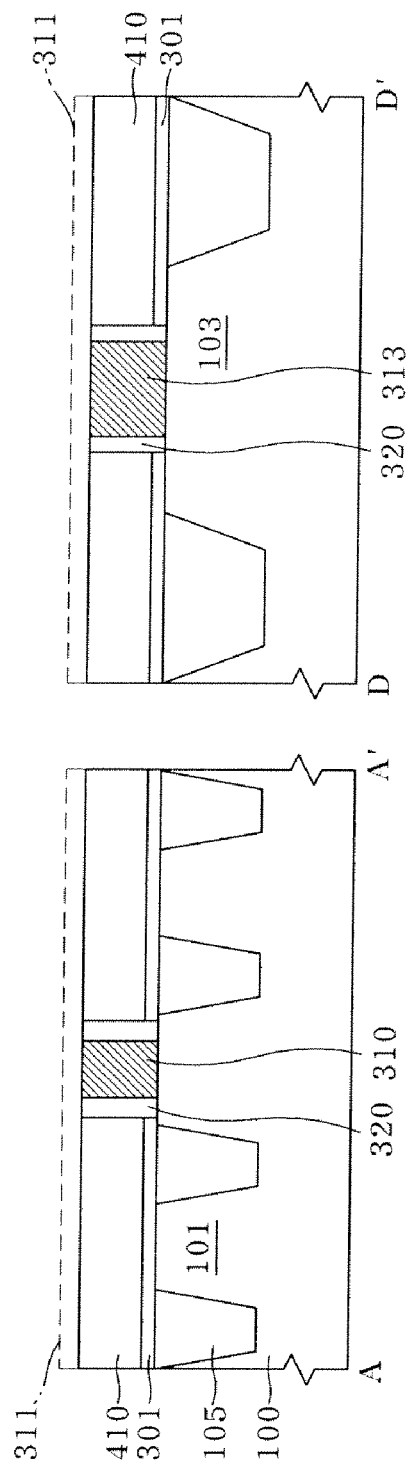

Referring to FIG. 6, a conductive layer 311, which may fill the first and second bit line contact holes 411, 413 and the attached hole spacer 320, may be formed. Node separation may be performed by a planarization process using suitable etch back or CMP techniques. Therefore, a first bit line contact 310 and the second bit line contact 313, which that may fill the first and second bit line contact holes 411, 413 respectively, may be formed. When performing the node separation through the planarization process using CMP, an end portion of a smooth profile in an upper portion of the hole spacer 320 may be polished and removed to make the upper CD of the first and second bit line contacts 310, 313 be equal to a lower CD. With this CMP process, since it is possible to prevent the upper CD of the first and second bit line contacts 310, 313 from becoming wider than the lower CD by the hole spacer 320, it may be possible to control of the contacts 310, 313 more precisely.

Figure 7:
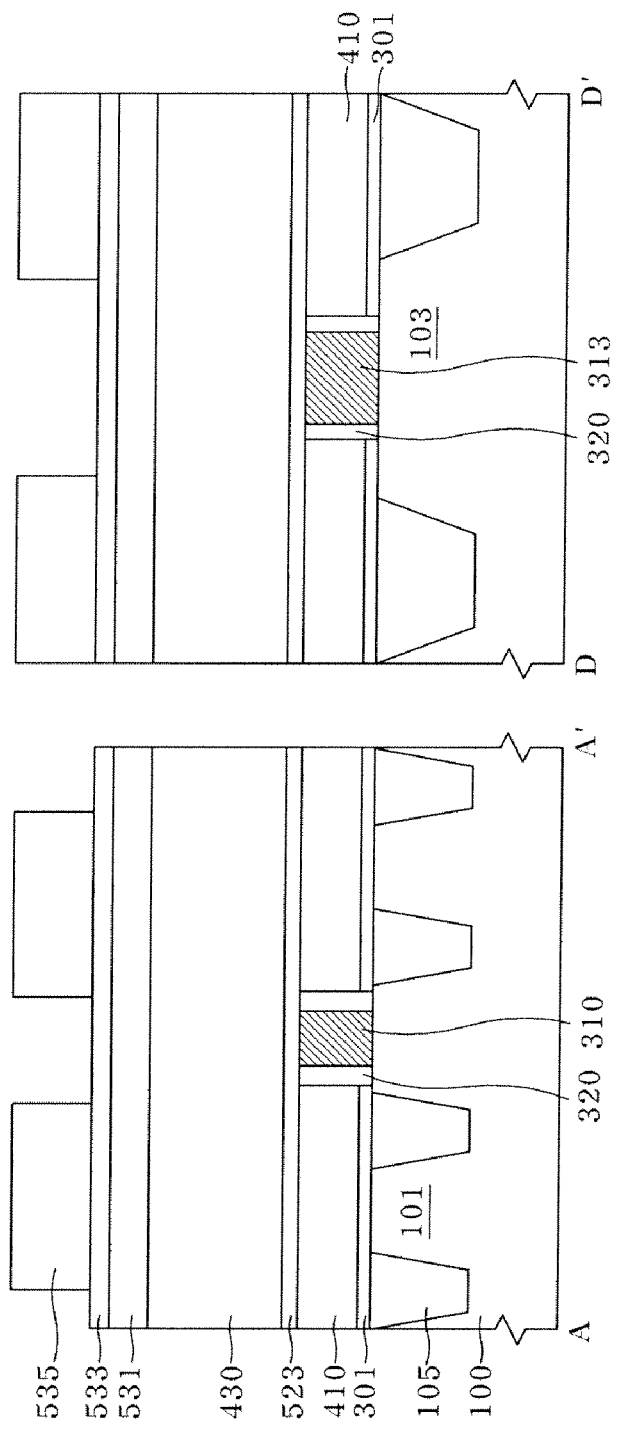

Referring to FIG. 7, the first and second bit line contacts 310, 313 may be formed in the first interlayer insulation layer 410 and a second stopper layer 523, thus preventing the first interlayer insulation layer 410 from being etched or corroded during subsequent processes. The second stopper layer 523 may include a silicon oxynitride (SiON) layer, and an a-carbon layer may be formed thereon for the purpose of etch selectivity.

A second interlayer insulation layer 430 may be formed on the second stopper layer 523. The second interlayer insulation layer 430 may be formed as a target layer on which a damascene process may be performed when the first bit line (such as the first bit line 330 illustrated in FIG. 1A) and the second bit line (such as the second bit line 333 illustrated in FIG. 1B) are formed. The second interlayer insulation layer 430 may include a silicon oxide layer. In order to form an etch mask for forming a damascene trench in the second interlayer insulation layer 430, a third hard mask layer 531 may be formed, including an a-carbon layer, on top of the second interlayer insulation layer 430, and a fourth hard mask layer 533 may be formed, including a silicon oxynitride (SiON) layer, on top of the third interlayer insulation layer 531.

A second photoresist pattern 535 created, for example, by an exposure process may be formed on the fourth hard mask layer 533. The fourth hard mask layer 533 (e.g., the SION layer) may function as a layer that prevents interlayer reaction between the third hard mask layer 531 (e.g., the a-carbon layer) and the second photoresist pattern 535, and the third hard mask layer 531 (e.g., the a-carbon layer) may function as a main hard mask. The second photoresist pattern 535 may have an opening that may expose the portion of the fourth hard mask layer 533 corresponding to the portion of the first bit line 330 shown in FIG. 1A and the portion of the second bit line 333 shown in FIG. 1B.

It may be possible to improve an exposure resolution in an exposure and development process for patterning the second photoresist pattern 535. Since the bit lines 330, 333 are arranged in a regular array of lines separated by spaces, it may be possible to achieve higher resolution in a photolithography process for transferring this array, or pattern, thus realizing a higher fidelity to the pattern shape. Therefore, the second photoresist pattern 535 can be formed in a pattern of a fine size required in a device with a design rule of, for example, 40 nm or less.

Figure 8:
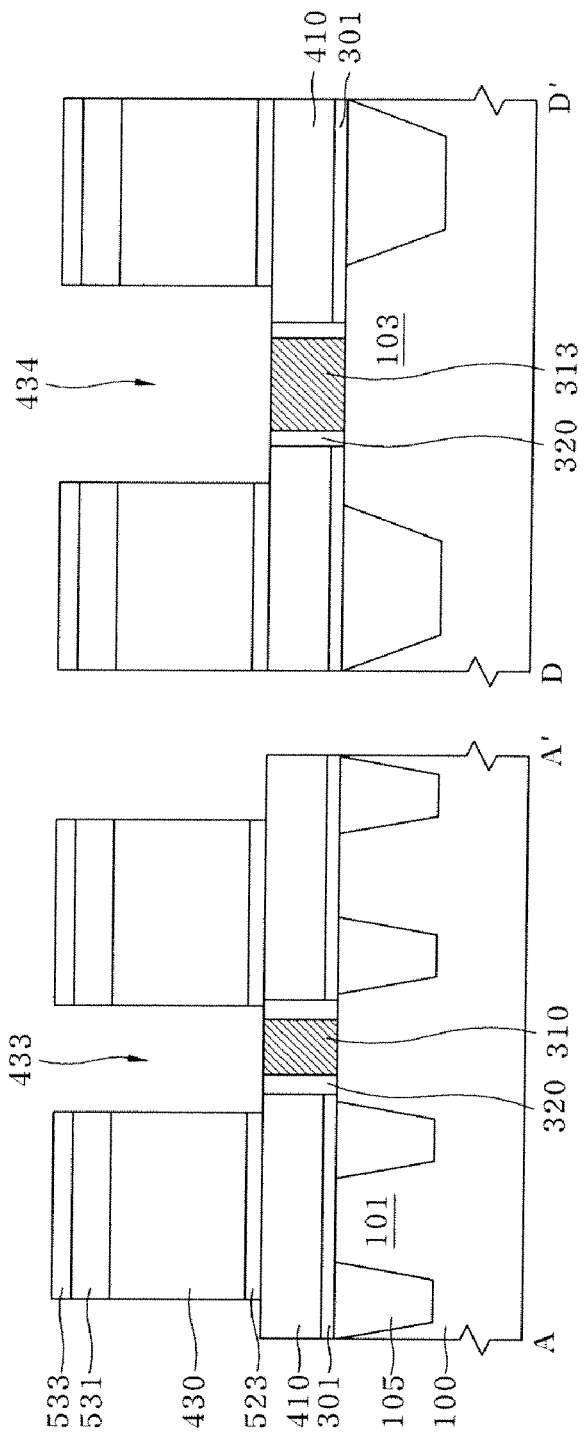

Referring to FIG. 8, the fourth hard mask layer 533 and the third hard mask layer 531 may be patterned by a selective etch using the second photoresist pattern (such as the second photoresist pattern 535 illustrated in FIG. 7) as an etch mask to form a second hard mask pattern 531, 533. The portion of the second interlayer insulation layer 430 under the second hard mask pattern 531, 535, which is exposed by the second hard mask pattern 531, 535, may be selectively etched to form a first damascene trench 433 that may expose the first bit line contact 310 in the cell region and a second damascene trench 434 that may expose the second bit line contact 313 in the peripheral region.

The etch process for forming the first and second damascene trenches 433, 434 may be performed to expose the second stopper layer 523. An additional etch process may be further performed to remove the exposed portion of the second stopper layer 523. That is, the second stopper layer 523 may function as an etch stop point at which the damascene etch process may be terminated. Even if each of the first and second damascene trenches 433, 434 is misaligned with the first and second bit line contacts 310, 313, since the damascene etch process is terminated at the second stopper layer 523, it may be possible to prevent a defect, e.g., of corrosion of the portion of the first interlayer insulation layer 410 under the second stopper layer 523, as a result of the damascene etch process. Therefore, it may be possible to achieve a wider alignment margin when aligning each of the first and second damascene trenches 433, 434 with the first and second bit line contacts 310, 313, respectively. It may therefore be possible to enlarge the process margin for forming the bit lines (such as the first bit line 330 illustrated in FIG. 1A and the second bit line 333 illustrated in FIG. 1B).

At this time, since the second damascene trench 434 is formed on the peripheral region together with the first damascene trench, it may be possible to form the bit lines 330, 333 in the cell region and the peripheral region with a single photomask at the same time. Therefore, when the bit line patterning process that uses separate etch processes on the cell region and on the peripheral region is introduced to form the bit lines 330, 333, it may be possible to reduce the number of the photomasks compared to when different photomasks that are required for the cell region and the peripheral region.

Figure 9:
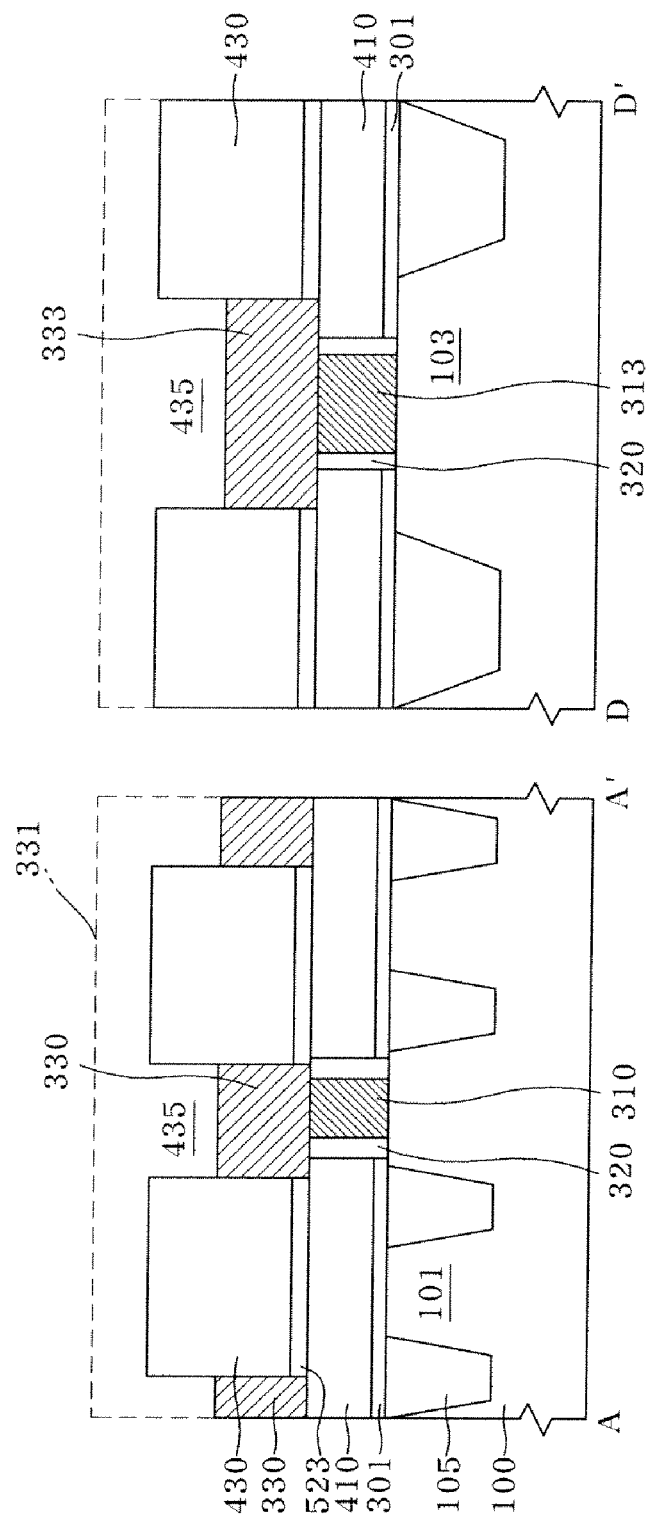

Referring to FIG. 9, the second hard mask pattern 531, 533 may be selectively removed and the first bit line 330 and the second bit line 333 that partially fill the first and second damascene trenches 433, 434, respectively, may be formed. A conductive layer, e.g. a metal layer such as tungsten (W) layer, that fills the first and second damascene trenches 433, 434, may be deposited and then etched back to perform a node separation. At this time, a barrier metal layer may be further formed as an interface layer under the tungsten layer. The barrier metal layer can be formed of a layer including titanium (Ti), titanium nitride (TIN) or tantalum nitride (TaN).

The etch back process of forming the first bit line 330 and the second bit line 333 inside the first and second damascene 433, 434 may be performed so that the first and second bit lines 330, 333 are recessed so as not to completely fill, but partially fill, the first and second damascene trench 433, 434. Therefore, concaved recess parts 435 may be formed on the upper sides of the first and second bit lines 330, 333.

Figure 10:
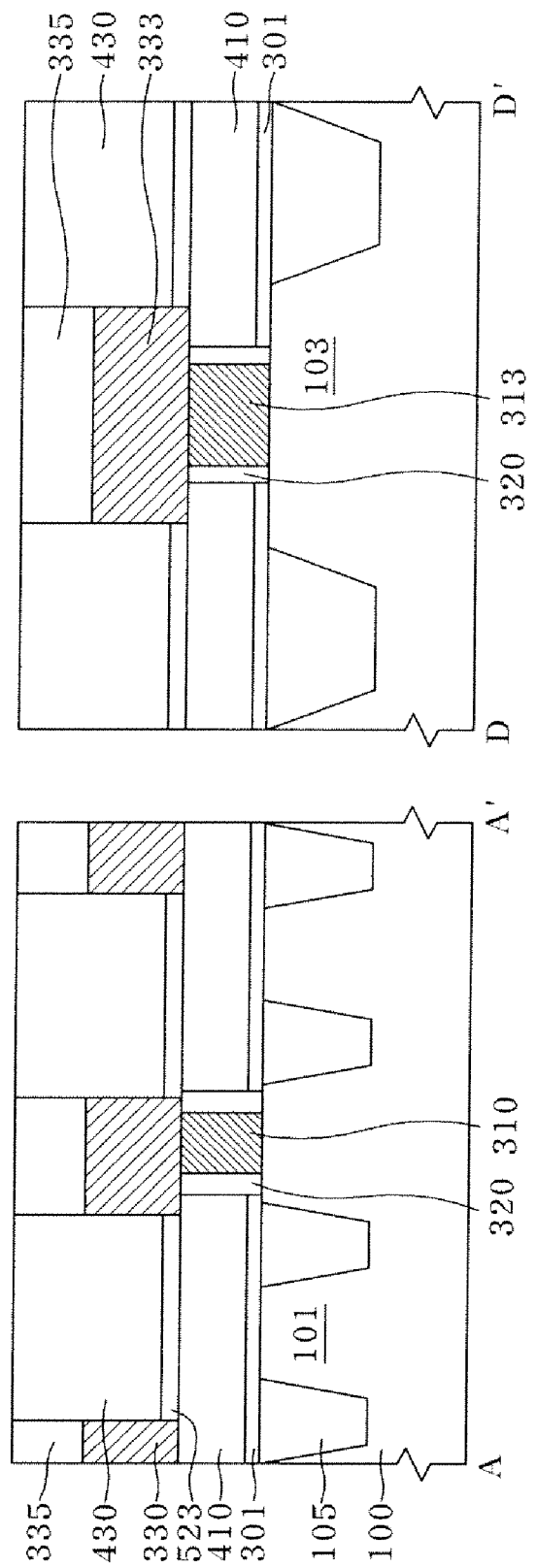

Referring to FIG. 10, a bit line capping layer 335 may fill the recess parts 435 on the upper sides of the first and second bit lines 330, 333. The bit line capping layer 335 may be formed by depositing an insulation layer (such as a silicon nitride, which has an etch selectivity to silicon oxide) and then planarizing using, for example, CMP. The bit line capping layer 335 may function to protect the upper sides of the first and second bit lines 330, 333.

In some embodiments, since the shapes of the bit lines 330, 333 may be formed following the first and second damascene trenches 433, 434, a process of selectively etching the conductive layer (e.g., the tungsten layer) may not be required. Therefore, it is possible to exclude a smooth side wall profile accompanied when etching the conductive layer so that the side walls of the bit lines 330, 333 have a vertical profile. Since the bit lines 330, 333 may be patterned not by the selective etch but by the introduction of the trenches 433, 434, it may be possible to realize a more regular gap between the bit lines 330, 333. It may also be possible to realize electrical isolation between the bit lines 330, 333 more reliably.

Figure 11:
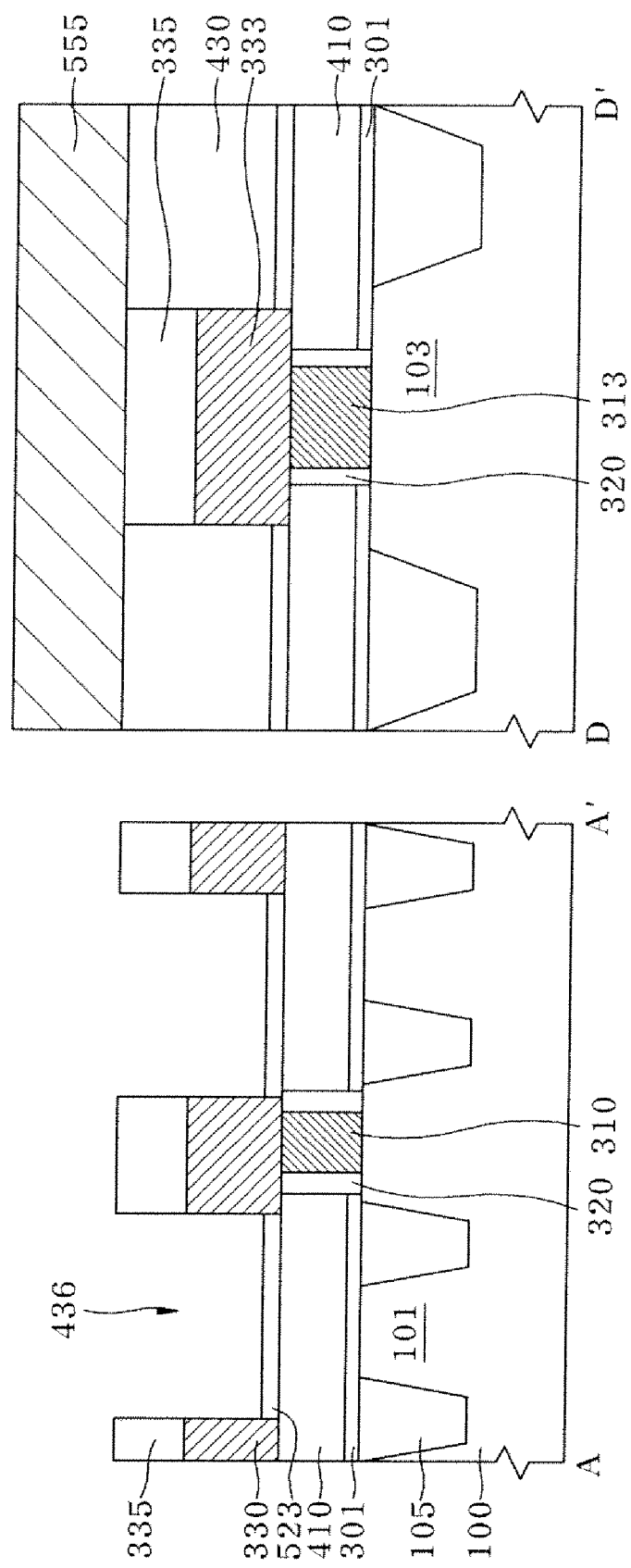

Referring to FIG. 11, a cell open mask 555 that may open the cell region may be formed. The cell open mask 555 may open the cell region and shield the peripheral region so that the subsequent process of forming the storage node contact may be performed only on the cell region. This cell open mask 555 can be maintained so as to prevent the portion of the second interlayer insulation layer 430 in the cell region from being corroded during a subsequent process of forming the storage node contact in the cell region.

The portion of the second interlayer insulation layer 430 remained in the cell region may be selectively etched to be removed using the cell open mask 555 as an etch mask. At this time, the selective etch process may be performed so as to expose the second stopper layer 523 placed under the second interlayer insulation layer 430. That is, the second stopper layer 523 may function as an etch stop point in the etch process of removing the second interlayer insulation 430. Since the etch may be terminated by the second stopper layer 523, the loss of the first interlayer insulation layer 410 under the second stopper layer 523 due to corrosion can be effectively prevented.

The second bit line 333 in the peripheral region may be insulated as a result of being isolated by the remaining portion of the second interlayer insulation layer 430. However, the side wall of the first bit line 330 may be exposed. By the selective removal of the second interlayer insulation layer 430 remaining between the first bit lines 330, a third damascene trench 436, which extends in the direction of the first bit lines 330, may be formed between the first bit lines 330. The third damascene trench 436 may be provided at both sides thereof with the first bit lines 330 as side walls. At this time, since a bit line capping layer 335 may be present at the upper side of the first bit line 330, damage of the profile may be prevented and thus the initial shape of the first bit line 330 may maintained.

Figure 12:
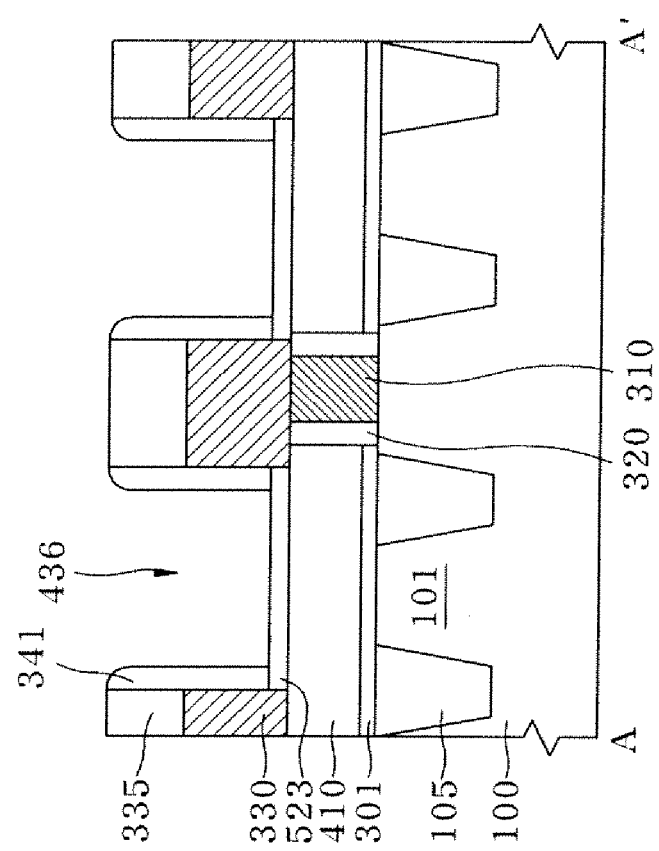

FIG. 12 illustrates a cross-section of an example semiconductor device illustrated in FIG. 1A taken along the line A-A'. The example semiconductor device includes a bit line spacer 341 that may cover and shield the exposed side walls of the first bit line 330. A layer for the bit line spacer 341 may be deposited, and an etch process, such as an anisotropic etch, for forming a spacer may then be performed. The bit line spacer 341 may function to prevent the first bit line 330 from being exposed and, thus, from being corrosively damaged. The bit line spacer 341 can be formed with silicon nitride having an etch selectivity to the silicon oxide of the first interlayer insulation layer 410 under the bit line spacer 341.

Figure 13:
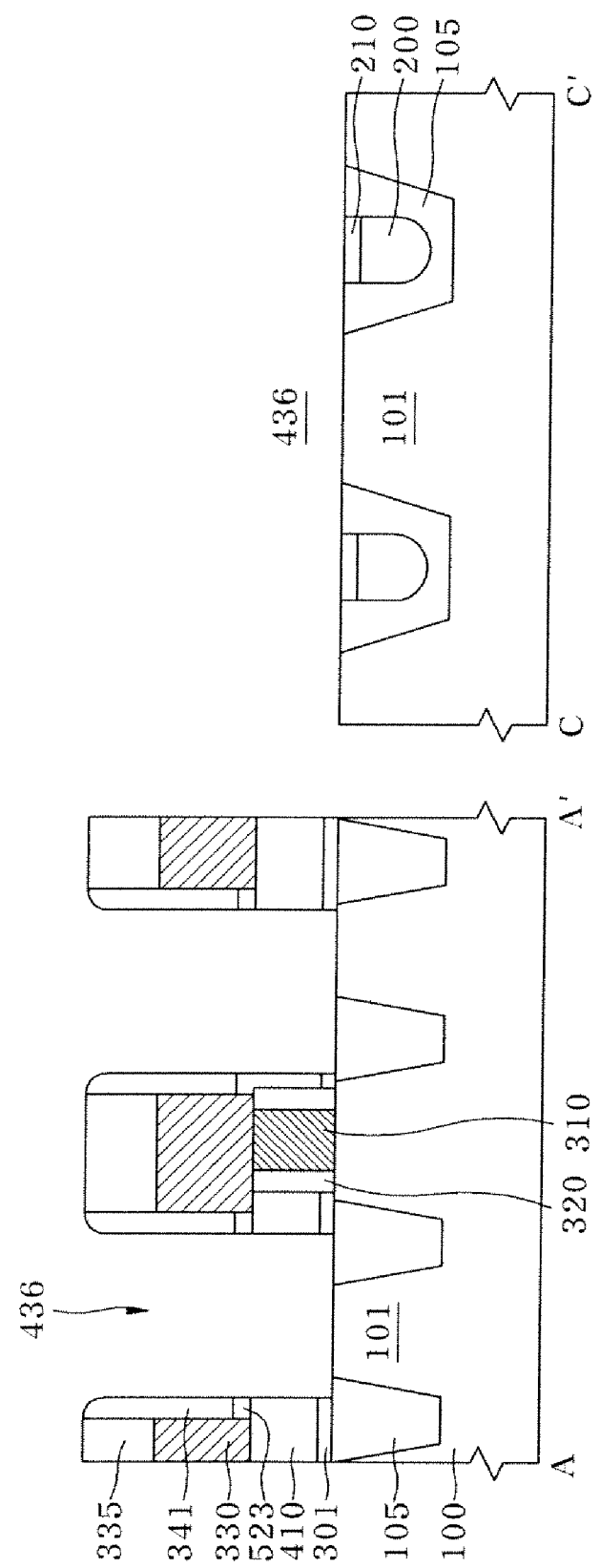

FIG. 13 illustrates cross-sections of the example semiconductor device illustrated in FIG. 1A taken along the A-A' and the C-C' lines. A bottom of the third damascene trench 436 may be selectively etched and removed with the first bit line 330 being protected by the bit line spacer 341 and the bit line capping layer 335. The portion of the second stopper layer 523 that is exposed to the third damascene trench 436 and the portion of the interlayer insulation layer 410 under the second stopper layer 523 may be selectively etched to expand the depth of the third damascene trench 436. the depth of the third damascene trench 436 may then be expanded so as to expose the surface of the active region 101. This etch process of expanding the depth of the third damascene trench 436 may be performed so that the etch may be terminated by the first stopper layer 301. After that, the portion of the first stopper layer 301 exposed to the expanded third damascene trench 436 may be selectively removed to expose the portion of the active region 101 under the first stopper layer 301. At this time, the gate 200 intersecting with the active region 101 may be protected by the gate capping layer 210 and may thus be shielded so as not to be exposed to the third damascene trench 436.

Figure 14:
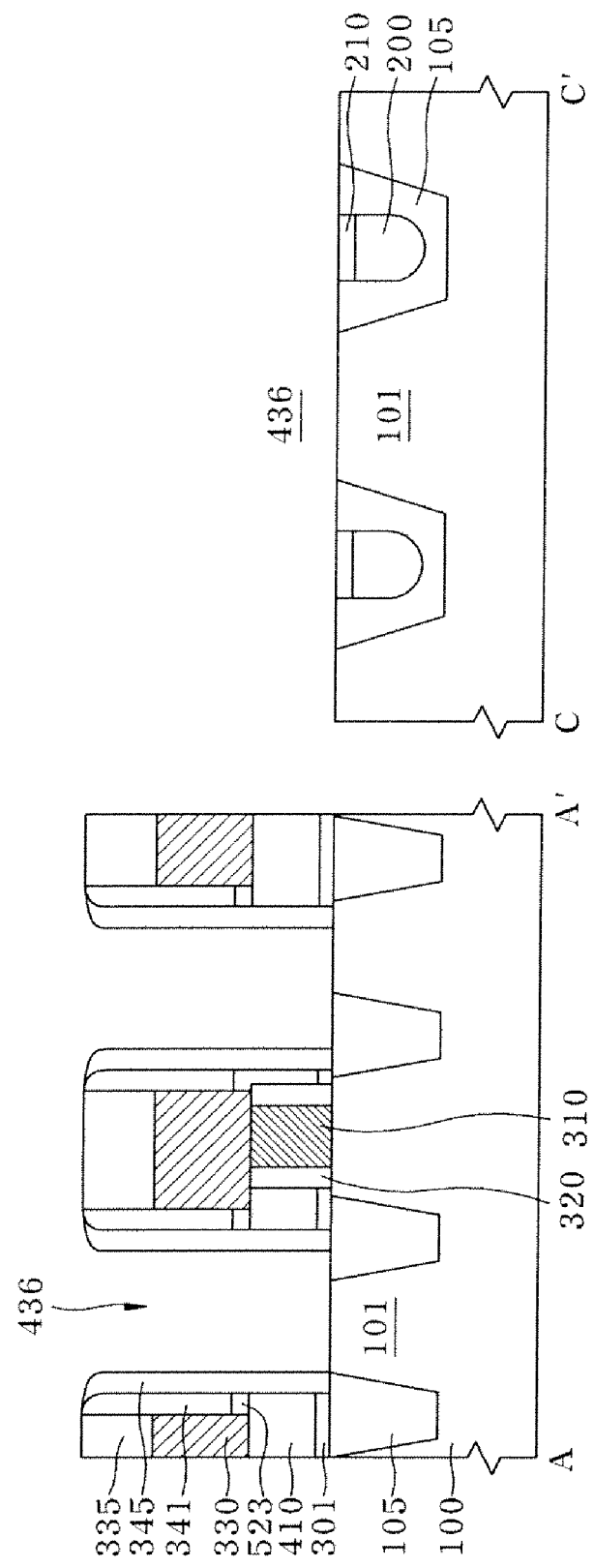

Referring to FIG. 14, a trench spacer 345 may be formed on the side walls of the expanded third damascene trench 436. This trench spacer 345 can be formed through deposition of a silicon nitride layer and a spacer etch. The trench spacer 345 may stacked on the bit line spacer 341 and, together with the bit line space, may function to shield the first bit line 330. The trench spacer 345 may also function to isolate and insulate the first bit line contact 310 from the third damascene trench 436. With introduction of the trench spacer 345, it may be possible to reliably prevent the first bit line contact 310 from being exposed to the third damascene trench 436 even when the first bit line 330 is overlaid with and/or misaligned with the first bit line contact 310.

Figure 15:
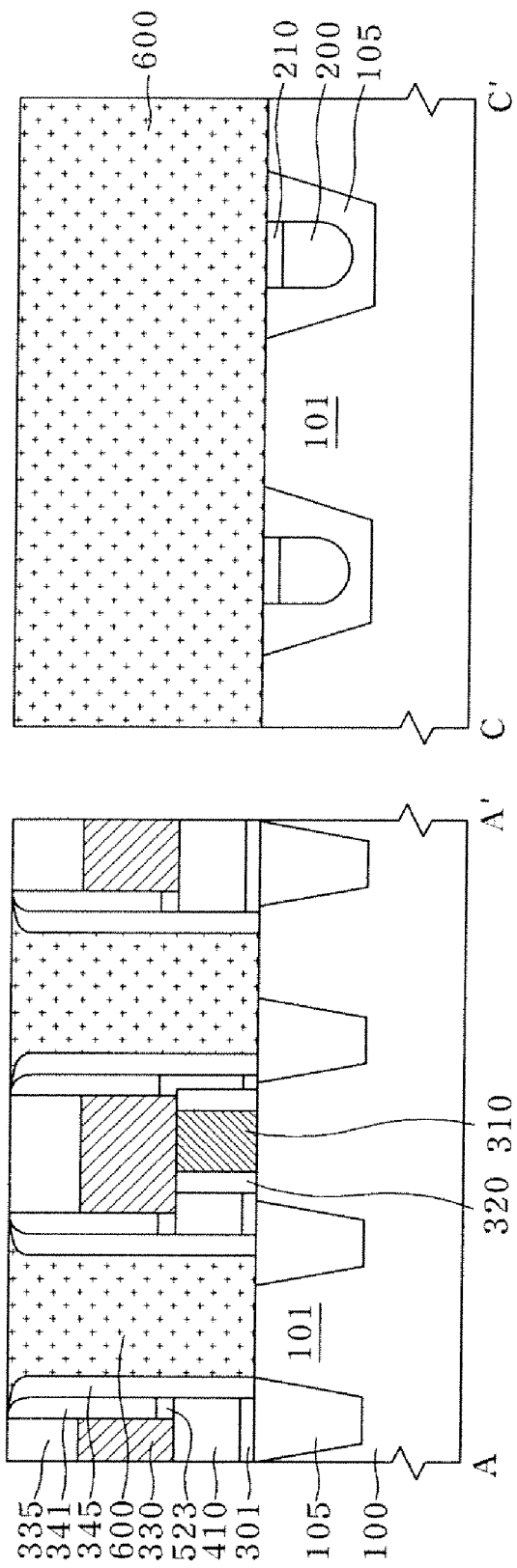

Referring to FIG. 15, a layer for the storage node contact, e.g. a conductive polysilicon layer, which may fill the third damascene trench 436, may deposited and then planarized by a CMP process to perform node separation. The CMP process may be performed until the bit line capping layer 335 is exposed to induce that the node separation of the layer is performed by the bit line capping layer 335. Therefore, a storage node contact line 600 may be node-separated to fill the third damascene trench 436. The storage node contact line 600 may be separated form and insulated from the first bit line contact 310 and the first bit line 330 by the bit line spacer 341 and the trench spacer 345. Since not only the bit line spacer 341 but also the trench spacer 345 are introduced, the storage node contact line 600 may be insulated from the first bit line contact 310 and the first bit line 330 even when the first bit line contact 310 and the first bit line 330 are misaligned. Therefore, it may be possible to have larger tolerance for the alignment margin with the first bit line contact 310 when forming the first bit line 330, and it may thus be possible to enlarge the process margin upon the formation of the first bit line 330.

Figure 16:
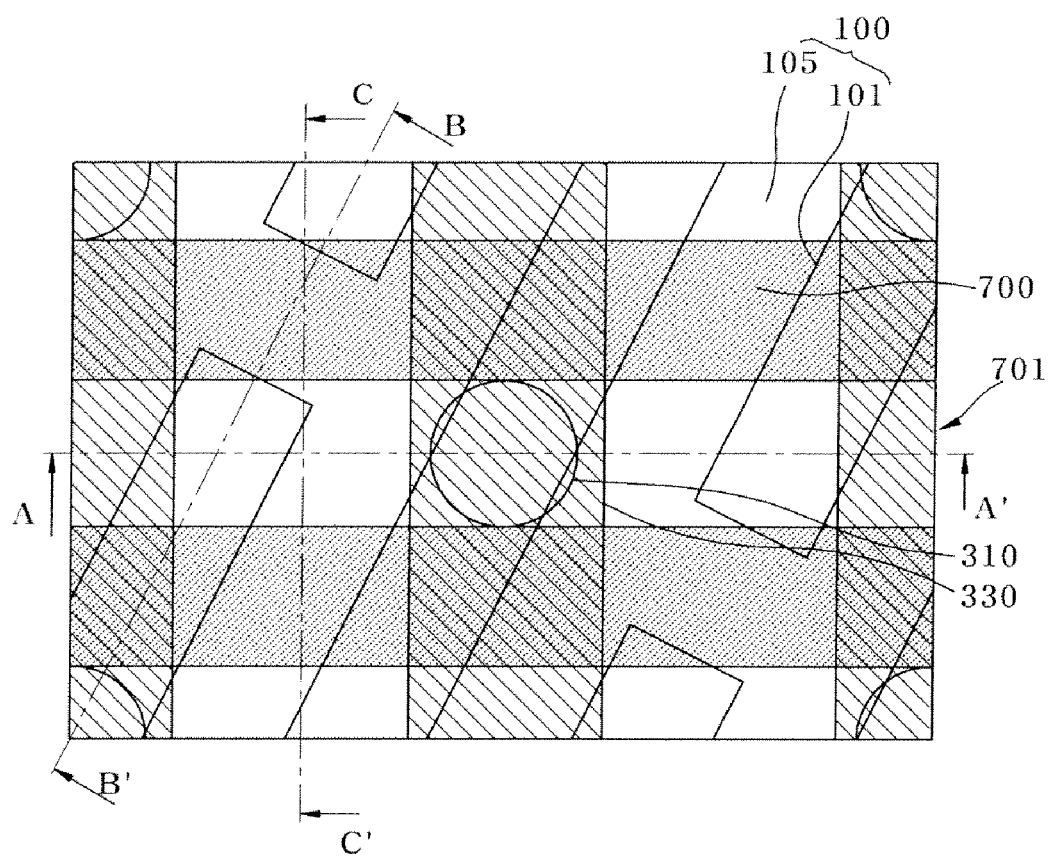
Figure 17:
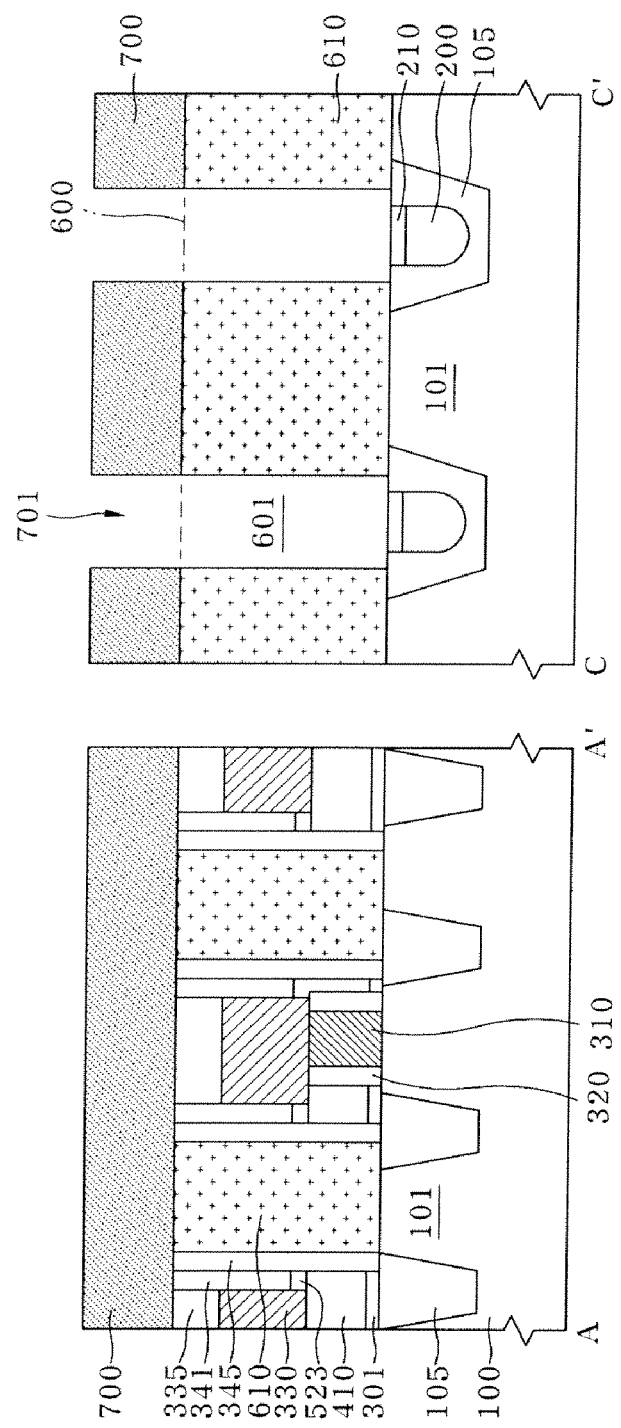

Referring to FIGS. 16 and 17, a selective etch process for separating the storage node contact line 600 into storage nodes 610 may be performed. A storage node contact mask 700, which may intersect with the storage node contact line 600, may be formed to intersect perpendicularly with the first bit line 330. The storage node contact mask 700 may be further formed to have the portion overlaid with the gate 200 as an opening part 701. This storage node contact mask 700 can be formed including a photoresist pattern, and it may be possible to improve an exposure resolution upon exposure of the photoresist pattern since the opening part 701 may have a linear shape and extend to overlay with the gate 200.

The portion of the storage node contact line 600 exposed to the opening part 701 of the storage node contact mask 700 may be selectively etched and removed to perform node separation on the storage node contact line 600 in a direction along which the first bit line 330 extends. At this time, the storage node contact 600 may be also node-separated in a direction along which the gate 200 extends since the storage node contact 600 may be previously node-separated with the first bit line 330 being placed therebetween by a CMP process. Therefore, the storage node contact 610 may be node-separated by the first bit line 330 and a separation groove 601 formed by an etch. The separation groove 601 may be etched by a selective etching until the portion of the semiconductor substrate 100 under the separation groove 601 is exposed. Therefore, since the storage node contact 610 may be separated by the formation of the separation groove 601, it may be possible to fundamentally exclude patterning defects, such as a bridges, that may arise in a SAC process.

Figure 18:
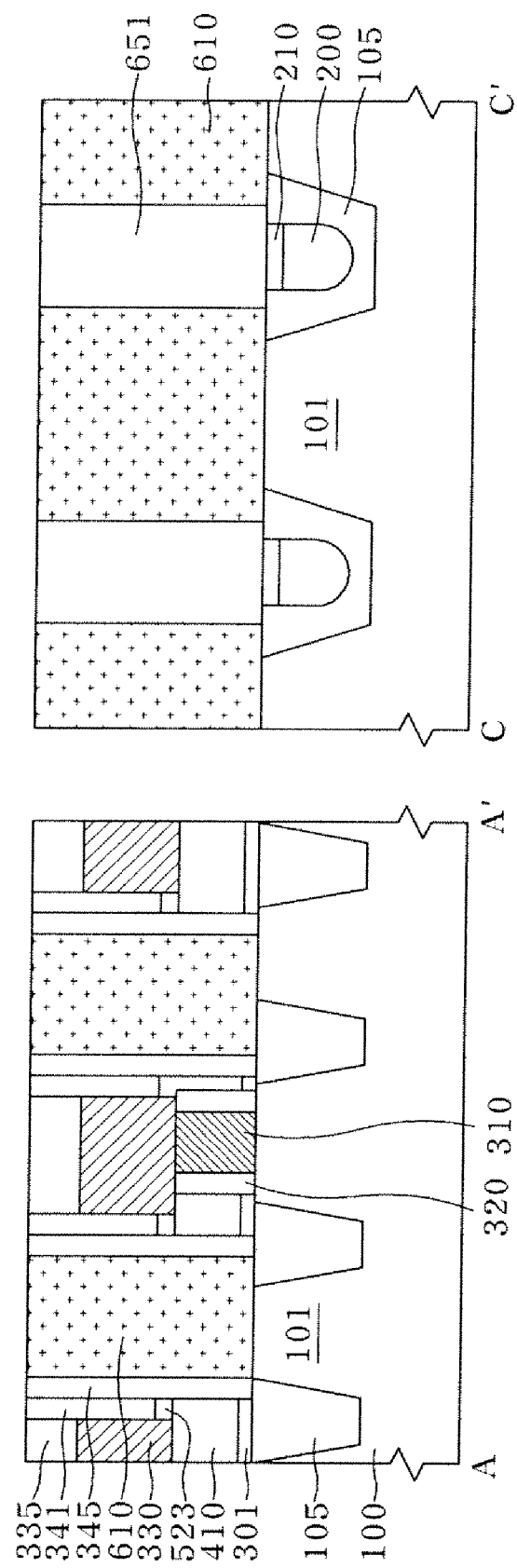

Referring to FIG. 18, a third interlayer insulation layer 651, which may fill the separation groove 601, may be deposited and CMPed so that the upper surface of the storage node contact 610 is exposed. The storage node contact 610 may isolated and insulated with respect to the extension direction of the gate 200 by the third interlayer insulation layer 651. The storage node contact 610 may be isolated from and insulated from the first bit line 330 by the bit line spacer 341 and the trench spacer 345. The storage node contact 610 may be isolated from and insulated from the first bit line contact 310 by the hole spacer 320 and the trench spacer 345.

With this dual spacer structure, the isolation between the storage node contact 610 and the first bit line contact 310, and the storage node contact 610 and the first bit line 330 can be realized more reliably. Even when misalignment is generated in the overlay between the first bit line 330 and the first bit line contact 310, it may be possible to effectively prevent the storage node contact 610 from self-aligning with the first bit line 330 and, thus, from being shorted with the first bit line contact 330. Therefore, although the CD of the first bit line 330 may be designed to be equal to the CD of the first bit line contact 310, it may be possible to effectively prevent an electric short caused by misalignment between the first bit line 330 and the first bit line contact 310. Therefore, it may be possible to form the first bit line 330 and the storage node contact 610 through a more stable process.

Figure 19:
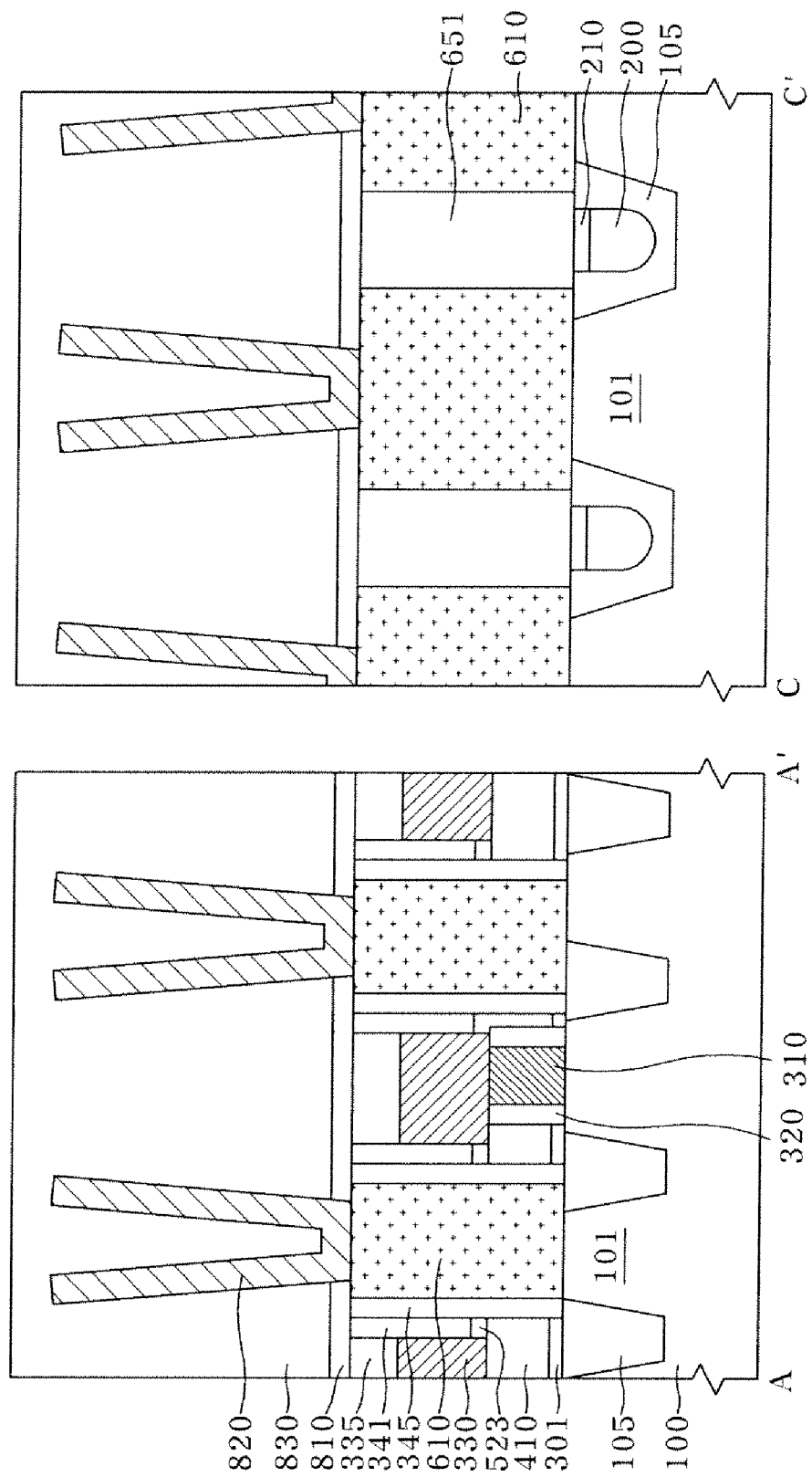

FIG. 19 illustrates cross-sections of an example semiconductor device illustrated in FIG. 1A taken along lines A-A' and C-C'. A storage node 820 of a capacitor electrically connected onto the storage node contact 610 may be formed. The storage node 820 can have a cylindrical shape in order to increase the capacity of the capacitor. At the bottom portion of the storage node 820, a support layer 810, which may support the storage node 820 and function as an etch stop point, can be formed including a silicon nitride layer. A dielectric layer (not shown) and a plate node (not shown) may be formed on this storage node 820, thereby realizing a capacitor. After the capacitor is realized, a fourth interlayer insulation layer 830, which may cover the capacitor, can be formed including a silicon oxide.

Figure 20:
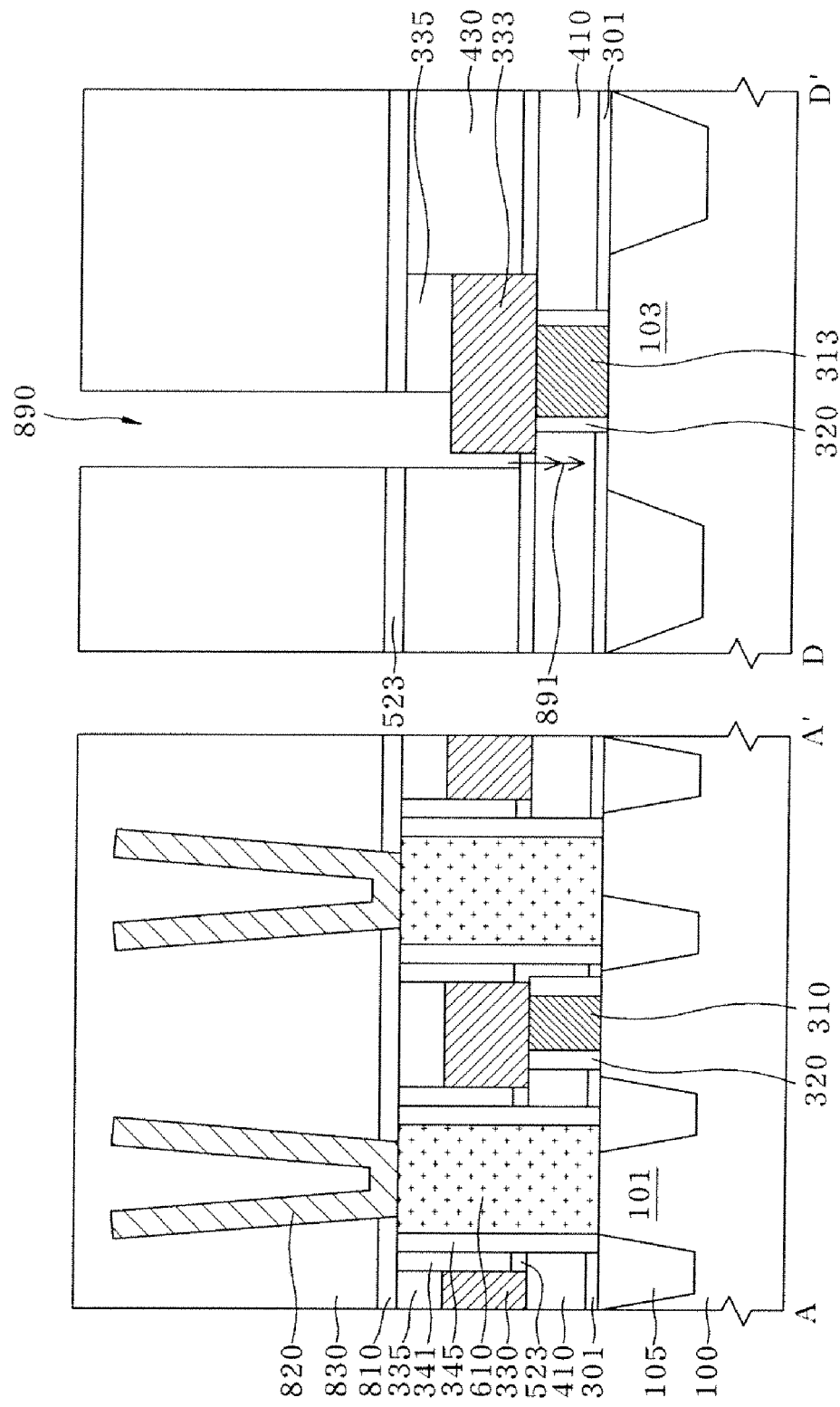

FIG. 20 illustrates cross-sections of an example semiconductor device illustrated in FIG. 1A taken along lines A-A' and D-D'. After the process of forming the capacitor is performed, a metal contact hole 890, which penetrates through the fourth interlayer insulation layer 830 and is aligned with the second bit line 333 under the metal contact hole 890 may be formed. The second bit line 333 in the peripheral region may be designed, as illustrated in FIG. 1B, so that the portion of the second bit line 333 that is in contact with a metal contact 900 may have a relatively wider CD in order to couple with the metal contact 900. The metal contact hole 890 may be formed for the interconnection metal contact (900 of FIG. 1B) for electrically coupling a metal wire (not shown) to be formed on the fourth interlayer insulation layer 830 and the second bit line 333 thereunder.

The metal contact hole 890 may be formed by selectively etching the portion of the fourth interlayer insulation layer 830 that is overlaid with the second bit line 333 in the peripheral region. The exposed portion of the support layer 810 thereunder exposed by the etch of the fourth interlayer insulation layer 830 may also be etched. The capping layer 335 on the second bit line 333 thereunder exposed by the etch of the support layer 810 may also be etched to expose an upper face of the second bit line 333.

When the metal contact hole 890 and the second bit line 333 are exactly overlaid, the metal contact hole 890 may substantially expose the upper face of the second bit line 333. However, when the metal contact hole 890 is misaligned with the second bit line 333, additional etching may be performed on the side portion of the second bit line 333 by an etch process of forming the metal contact hole 890. The metal contact hole 890 may thus be expanded to expose the second active region 103 under the metal contact hole 890 or the gate adjacent to the second active region 103. In some embodiments, the second stopper layer 523, which may cover and shield the first interlayer insulation layer 410, may be present in the side portion of the second bit line 333.

This second stopper layer 523 may function to prevent the etch process of forming the metal contact hole 890 from proceeding to the first interlayer insulation layer 410 under the metal contact hole 890. The metal contact hole 890 may thus be etched only to expose the side face of the second bit line 333 but may be prevented from expanding to expose the second active region 103 thereunder. Therefore, since it may be possible to solve the problem of a misalignment between the metal contact hole 890 and the second bit line 333, it may be possible to achieve a wider alignment margin. Therefore, as illustrated in FIG. 1B, the CD of the second bit line 333 can be reduced to a size equal to the CD of the metal contact 900, which may be formed to fill the metal contact hole 890.

When a short due to the misalignment occurs, the CD of the second bit line 333 may be enlarged so as to be larger than the CD of the metal contact 900, e.g. by 23 nm. In this case, the CD of the other portion of the second bit line 333 not aligned with the metal contact 900 may be relatively reduced and the resulting minimum pitch can be reduced to 114 nm. Therefore, a patterning margin allowed upon patterning of the second bit line 333 may become dwindle. In some embodiments, since it may be possible to reduce the CD of the second bit line 333 so that it has the size equal to the CD of the metal contact 900, the CD of the other portion of the second bit line 333 not aligned with the metal contact 900 can be relatively enlarged. Therefore, the minimum pitch can be enlarged to 132 nm and it may thus be possible to improve the process margin depending on the increase in the minimum pitch.

Figure 21:
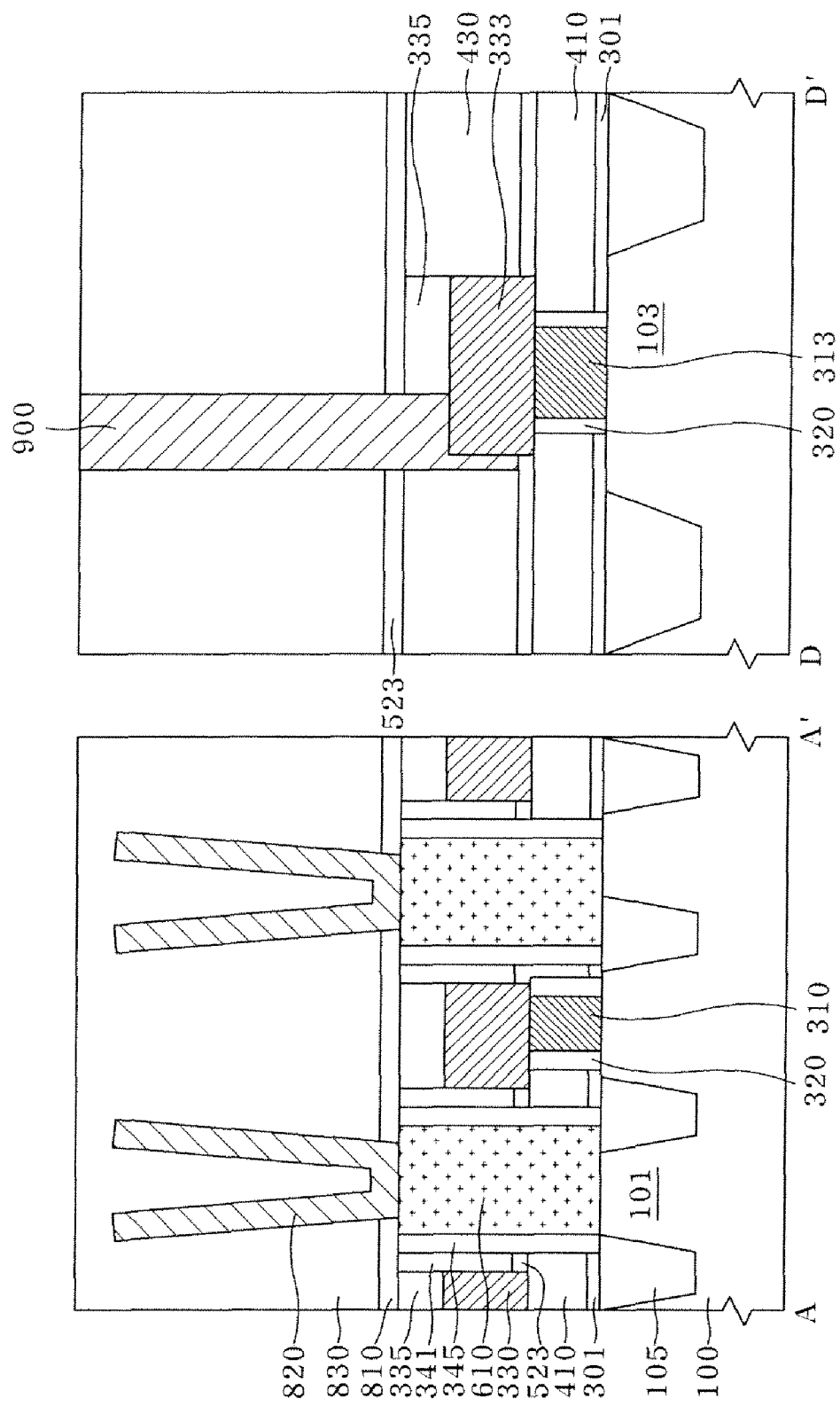

Referring to FIG. 21, the metal contact which fills the metal contact hole 890 may be formed. Even when the metal contact hole 890 for the metal contact 900 is misaligned with the second bit line 333, the metal contact hole 890 may be formed only to form the side face of the second bit line 333 and the expansion of the metal contact hole 890 to the semiconductor substrate 100 may be prevented. Since the side face of the second bit line 333 may be exposed to the metal contact hole 890, a contact area between the metal contact 900 which fills the metal contact hole 890 and the second bit line 333 may not be reduced despite the misalignment, and it may thus be possible to prevent an increase in a contact resistance. This metal contact 900 can be formed by depositing metal material such as tungsten (W) and performing node separation with, for example, CMP planarization, etc. A metal wire (not show) coupled to the metal contact may be formed on the fourth interlayer insulation 830. The metal wire may therefore form an interconnection wire of a semiconductor device.

In some embodiments, it may be possible to realize node separation between the contacts 610 more reliably when forming the storage node contact 610, and it may thus be possible to prevent the bridge phenomenon between the storage node contacts 610. With the introduction of a dual spacer structure using the bit line spacer 341 and the trench spacer 345, it may be possible to prevent shorts between the bit line 330 and the storage node contact 610 and shorts between the storage node contact 610 and the bit line contact 310. Thus, it may be possible to achieve a wider margin of the process of forming the storage node contact 610. Even when misalignment between the bit line 333 and the metal contact 900 occurs, it may be possible to prevent shorts from occurring between the metal contact 900 and the semiconductor substrate 100 thereunder or the gate 200 by introducing the stopper layer 523. Therefore, it may be possible to reduce the CD of the portion of the bit line 333 aligned with the metal contact 900 and thus achieve more margin of the process of patterning the bit line 333.

While the present interconnection wiring structures of semiconductor devices and method of manufacturing such devices have been described with respect to specific embodiments, it will be apparent to those skilled in the art that various changes and modifications may be made without departing from the spirit and scope of this disclosure, which would still fall within the scope of the following claims.

What is claimed is:

1. A method for manufacturing an interconnection wiring structure of a semiconductor device, the method comprising:
    forming an isolation region, wherein the isolation region arranges an active region in a diagonal direction with respect to a semiconductor substrate;
    forming a first interlayer insulation layer on the active region;
    forming a plurality of bit line contacts, wherein the bit line contacts penetrate the first interlayer insulation layer, and wherein the bit line contacts are coupled to the active region;
    forming a second interlayer insulation layer, wherein the second interlayer insulation layer covers the bit line contacts;
    forming a plurality of first damascene trenches by selectively etching the second interlayer insulation layer, wherein the first damascene trenches expose a plurality of upper portions of the bit line contacts;
    forming a plurality of bit lines, wherein the bit lines fill the first damascene trenches;
    forming a second damascene trench by selectively etching a portion of the second interlayer insulation layer between the bit lines and selectively etching a portion of the first interlayer insulation layer, wherein the second damascene trench exposes a portion of the active region;
    attaching a trench spacer on side walls of the second damascene trench;
    forming a storage node contact line, wherein the storage node contact line fills the second damascene trench;
    forming a mask having a linear shape, wherein the mask intersects with the storage node contact;
    forming node separation grooves by selectively etching the portion of the storage node contact line exposed by the mask, wherein the node separation grooves separate the storage node contact line into storage node contacts; and
    forming a third interlayer insulation layer, wherein the third interlayer insulation layer fills and insulates the node separation grooves.

2. The method of claim 1, further comprising: forming a buried gate, wherin the buried gate extends to intersect the active region.

3. The method of claim 2, whererin forming the burierd gate comprises:
    forming a gate trench, wherein the gate trench intersects the active region;
    forming a metal layer for the gate, wherein the metal layer partially fills the gate trench;
    forming a capping layer on the metal layer, wherein the capping layer fills a remaining portion of the gate; and
    forming a first stopper layer on the semiconducter substrate, wherein the first stopper layer covers the gate capping layer.

4. The method of claim 1, wherein forming each of the bit line contacts comprises:
    forming a bit line contact hole, wherein the bit line contact hole penetrates the first interlayer insulation layer;
    forming hole spacers for controlling a critical dimension (CD) of the bit line contact on side walls of the bit line contact hole; forming a conductive layer, wherein the conductive layer fills the bit line contact holes; and
    performing node separation by planarizing the conductive layer.

5. The method of claim 4, wherein the node separation comprises chemical mechanical polishing (CMP) of the conductive layer so that the upper end of the hole spacer is polished and removed.

6. The method of claim 1, further comprising forming a second stopper layer, wherein the second stopper layer extends to cover the bit line contacts in an interface between the first interlayer insulation layer and the second interlayer insulation layer so that the second stopper layer is detected as an etch stop point upon the formation of the first damascene trench.

7. The method of claim 6, further comprising:
    forming a capacitor having a storage node connected to one of the storage node contacts;
    forming a fourth interlayer insulation layer, wherein the fourth interlayer insulation layer covers the capacitor;
    forming a contact hole, wherein the contact hole penetrates the fourth interlayer insulation layer and the second interlayer insulation layer on a peripheral region of the semiconductor substrate, and wherein the contact hole is aligned with one of the bit lines, and wherein the second stopper layer prevents the contact hole from penetrating the into the first interlayer insulation layer; and
    forming an interconnection contact, wherein the interconnection contact fills the contact hole.

8. The method of claim 1, wherein forming the second damascene trench comprises:
    forming a hard mask having a carbon layer and a silicon oxynitride (SiON) layer on the second interlayer insulation layer; and
    selectively etching a portion of the second interlayer insulation layer that is exposed by the hard mask.

9. The method of claim 1, wherein forming each of the bit lines comprises:
    forming a conductive layer, wherein the conductive layer fills the first damascene trench;
    forming a concaved recess portion on the conductive layer by performing etch back to make an upper surface of the bit line lower than a surface of the second interlayer insulation layers and
    forming a bit line capping layer, wherein the bit line capping layer fills the recess portion to cover and protect the upper surface of the bit line.

10. The method of claim 9, wherein forming the second damascene trench comprises:
    forming a cell open mask, wherein the cell open mask exposes a portion of the second interlayer insulation layer in the cell region;
    selectively etching the portion of the second interlayer insulation layer exposed by the cell open mask and the bit line capping layers;
    forming bit line spacer spacers on side walls of the bit line exposed by the portions of the second interlayer insulation layer; and
    selectively etching a portion of the first interlayer insulation layer exposed by the bit line spacers.

11. The method of claim 10, wherein the trench spacer extends so as to be attached to the side wall of the bit line spacers.

12. The method of claim 10, wherein forming the storage node contact line comprises:
    forming a conductive polysilicon, wherein the conductive polysilicon layer fills the second damascene trench; and performing node separation by chemically-mechanically polishing the polysilicon layer so that the bit line capping layers are exposed.

13. A method for manufacturing an interconnection wiring structure of a semiconductor device, the method comprising:
forming a first interlayer insulation later;
forming a first bit line contact, wherein the first bit line contact penetrates the first interlayer insulation layer, and wherein the first bit line contact is aligned with a cell region on a semiconductor substrate;
forming a second bit line contact, wherein the second bit line contact penetrates the first interlayer insulation layer, and wherein the second bit line contact is aligned with a peripheral region on the semiconductor substrate;
forming a second interlayer insulation layer, wherein the second interlayer insulation layer covers the first bit line contact and the second bit line contact;
forming first and second damascene trenches by selectively etching the second interlayer insulation layer, wherein the first and second damascene trenches expose upper portions of the first and second bit line contacts, respectively;
forming first and second bit lines, wherein the first and second bit lines fill the first and second damascene trenches respectively;
forming a third damascene trench by selectively etching a portion of the second interlayer insulation layer between the first bit line and the second bit line, and selectively etching a portion of the first interlayer insulation layer thereunder, wherein the third damascene trench exposes a portion of the semiconductor substrate in the cell region;
attaching trench spacer on side walls of the third damascene trench;
forming a storage node contact line, wherein the storage node contact line fills the third damascene trench;
forming a mask having an opening of a linear shape, wherein the opening intersects with the storage node contact;
forming node separation grooves by selectively etching portions of the storage node contact line exposed by the mask, wherein the node separation grooves separate the storage node contact line into storage node contacts;
forming a third interlayer insulation layer, wherein the third interlayer insulation layer fills and insulates the node separation grooves;
forming a capacitor having a storage node connected to the storage node contact;
forming a fourth interlayer insulation layer, wherein the fourth interlayer insulation layer covers the capacitor;
forming a contact hole, wherein the contact hole penetrates the fourth and second interlayer insulation layers on the peripheral region of the semiconductor substrate, and wherein the contact hole is aligned with the second bit line; and
forming an interconnection contact, wherein the interconnection contact fills the contact hole.

14. The method of claim 13, further comprising:
forming an isolation region, wherein the isolated region arranges a first active region in a diagonal direction with respect to the semiconductor substrate in the cell region the semiconductor substrate and second active region in the peripheral region of the semiconductor substrate; and
forming buried gates which extend to intersect the active regions.

15. The method of claim 14, wherein forming each of the buried gates comprises:
forming gate trench, wherein the gate trench intersects the first active region;
forming a metal layer, wherein the metal layers fills a portion of the gate trench;
forming a capping layer on the metal layer, wherein the capping layer fills a remaining portion of the gate trench, thereby forming a gate capping layer; and
forming a first stopper layer on the semiconductor substrate, wherein the first stopper layer covers the gate capping layer.

16. The method of claim 13, wherein forming the first and second bit line contacts comprises:
forming bit line contacts that penetrate the interlayer insulation layer;
forming a hole spacer for controlling CDs of the first and second bit line contacts on a side wall of the bit line contact hole;
forming a conductive layer, wherein the conductive layer fills the bit line contact holes; and
performing node separation by planarizing the conductive layer.

17. The method of claim 13, further comprising forming a second stopper layer, wherein the second stopper layer covers the first and second bit line contacts in a interface between the interlayer insulation layer and the first interlayer insulation layer.

18. The method of claim 17, wherein the second stopper layer incudes silicon oxynitride (SiON) so that the second stopper layer provides an etch stop point upon the formation of the first and second damascene trenches.

19. The method of claim 13, wherein forming the first and second bit lines comprises:
forming a conductive layer, wherein the conductive layer fills the first and second damascene trenches;
forming a concaved recess portion on the conductive layer by performing etch back to make upper surfaces of the first and second bit lines lower than a surface of the second interlayer insulation layer; and
forming a bit line capping layer, wherein the bit line capping layer fills the recess portion to cover and protect the upper surfaces of the first and second bit lines.

20. The method of claim 13, wherein forming the third damascene trenches comprises:
forming a cell open mask, wherein the cell open mask exposes a portion of the second interlayer insulation layer in the cell region;
selectively etching the portion of the second interlayer insulation layer exposed by the cell open mask;
forming a bit line spacer on a side wall of the first bit line exposed by the portion of the second interlayer insulation layer; and
selectively etching a portion of the first interlayer insulation layer exposed by the bit line spacer.

* * * * *